(12) United States Patent
Kim et al.

(10) Patent No.: US 8,124,520 B2
(45) Date of Patent: Feb. 28, 2012

(54) INTEGRATED CIRCUIT MOUNT SYSTEM WITH SOLDER MASK PAD

(75) Inventors: KyungOe Kim, Daegeon (KR); Haengcheol Choi, Kyonggi-do (KR); Kyung Moon Kim, Youngin-si (KR); Rajendra D. Pendse, Fremont, CA (US)

(73) Assignee: Stats Chippac Ltd., Singapore (SG)

( * ) Notice: Subject to any disclaimer, the term of this patent is extended or adjusted under 35 U.S.C. 154(b) by 739 days.

(21) Appl. No.: 11/456,551

(22) Filed: Jul. 10, 2006

(65) Prior Publication Data

US 2008/0014738 A1 Jan. 17, 2008

(51) Int. Cl.
*H01L 23/52* (2006.01)
*H01L 21/00* (2006.01)

(52) U.S. Cl. .......... 438/614; 257/779; 257/612

(58) Field of Classification Search .......... 438/614, 438/612, 613; 330/777–781, 737, 738
See application file for complete search history.

(56) References Cited

U.S. PATENT DOCUMENTS

| | | | |
|---|---|---|---|
| 5,400,948 A | 3/1995 | Sajja et al. | |
| 6,348,142 B1 | 2/2002 | Vivares et al. | |
| 6,356,958 B1 | 3/2002 | Lin | |
| 6,432,291 B1 | 8/2002 | Vivares et al. | |
| 6,759,318 B1 | 7/2004 | Chang | |
| 6,911,604 B2 | 6/2005 | Tsai et al. | |
| 6,940,179 B2 | 9/2005 | Lee | |
| 7,036,712 B2 | 5/2006 | Joy et al. | |
| 7,078,272 B2 * | 7/2006 | Ho et al. | 438/127 |
| 7,294,929 B2 * | 11/2007 | Miyazaki | 257/737 |
| 2006/0055018 A1* | 3/2006 | Sekiguchi et al. | 257/686 |
| 2009/0212444 A1* | 8/2009 | Shen | 257/779 |

* cited by examiner

*Primary Examiner* — Michael Shingleton
(74) *Attorney, Agent, or Firm* — Mikio Ishimaru

(57) ABSTRACT

An integrated circuit mount system includes an integrated circuit, a solder mask for the integrated circuit, and a solder mask pad on the substrate with the solder mask.

20 Claims, 2 Drawing Sheets

INTEGRATED CIRCUIT MOUNT SYSTEM WITH SOLDER MASK PAD

TECHNICAL FIELD

The present invention relates generally to integrated circuits, and more particularly to a system for integrated circuit mount.

BACKGROUND ART

Across virtually all applications, there continues to be growing demand for reducing size and increasing performance of integrated circuits. The seemingly endless demand is no more visible than in products of our daily lives. Smaller and denser integrated circuits are required in many portable electronic products, such as cell phones, portable computers, voice recorders, etc. as well as in many larger electronic systems, such as cars, planes, industrial control systems, etc. As the demand grows for smaller electronic products with more features, manufacturers are seeking ways to include more features as well as reduce the size of the integrated circuits. To meet these needs, integrated circuits are increasingly using smaller form factors with more connections.

Wafer manufacturers strive to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. Attention has therefore increasingly shifted to integrated circuit interconnection as a means to fulfill the relentless demands for increased density and reduced area.

Chip scale interconnection, including flipchips, allow higher performance and reduced area for integrated circuits. Flipchips use connections directly on integrated circuits to interconnect to a mount or a system. Integrated circuit input/output pads are typically unsolderable and susceptible to corrosion if left exposed. Consequently, bond pads are often formed to include the input/output pad and one or more additional metal layers that promote wetting and metallurgical bonding with solder bump alloys. The additional metal layers, or under bump metallurgy (UBM), provides a surface that will readily bond with solder balls or bumps.

Other aids may be used including what is commonly referred to as a "solder mask" or "coverlay". The solder mask layer may be applied by laminating a preformed dielectric sheet to the surface of the dielectric element, or by forming the dielectric sheet from a curable liquid on the surface of the dielectric element. The solder mask has holes at spacing corresponding to the spacing of the pads. The solder mask closely overlies the trace-bearing surface of the panel and closely overlies the metallic traces, leaving all or part of each pad exposed at the corresponding hole in the solder mask.

A mass of solder may be deposited on each pad, either by exposing the assembly to a liquid solder to form solder balls or solder bumps onto the pads. The molten solder forms a strong bond to the metal of the pads. The solder mask layer, which does not bond to the solder, confines the solder on the pads. In the absence of the solder mask layer, the molten solder could bond to metal in the traces extending away from the pads and could flow outwardly, along the traces. This would provide solder in undesired locations and displace the solder mass from its desired location, centered on the pad. The undesired solder flow can also remove solder from the pads where it is required for forming the joints. The solder mask prevents this undesired flow.

Existing attempts to interconnect integrated circuits with solder, suffer from misalignment of the solder mask layer and the pad or UBM. This misalignment results in poor, unreliable, or missing connections. Attempts to solve this misalignment have resulted in creating large pads and UBM structures to account for offsets between the solder mask and the pad or UBM. A large pad and associated UBM create additional problems including defeating the solder mask's ability to confine the solder, increasing intermetallic cracking, weakening intermetallic bonding, and decreasing pad density.

Thus, a need still remains for an integrated circuit mount system to provide improved solder on pad area, accuracy, and reliability. In view of the increasing demand for improved integrated circuits and particularly more functions in smaller products at lower costs, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit, forming a solder mask for the integrated circuit, and forming a solder mask pad on a substrate with the solder mask.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
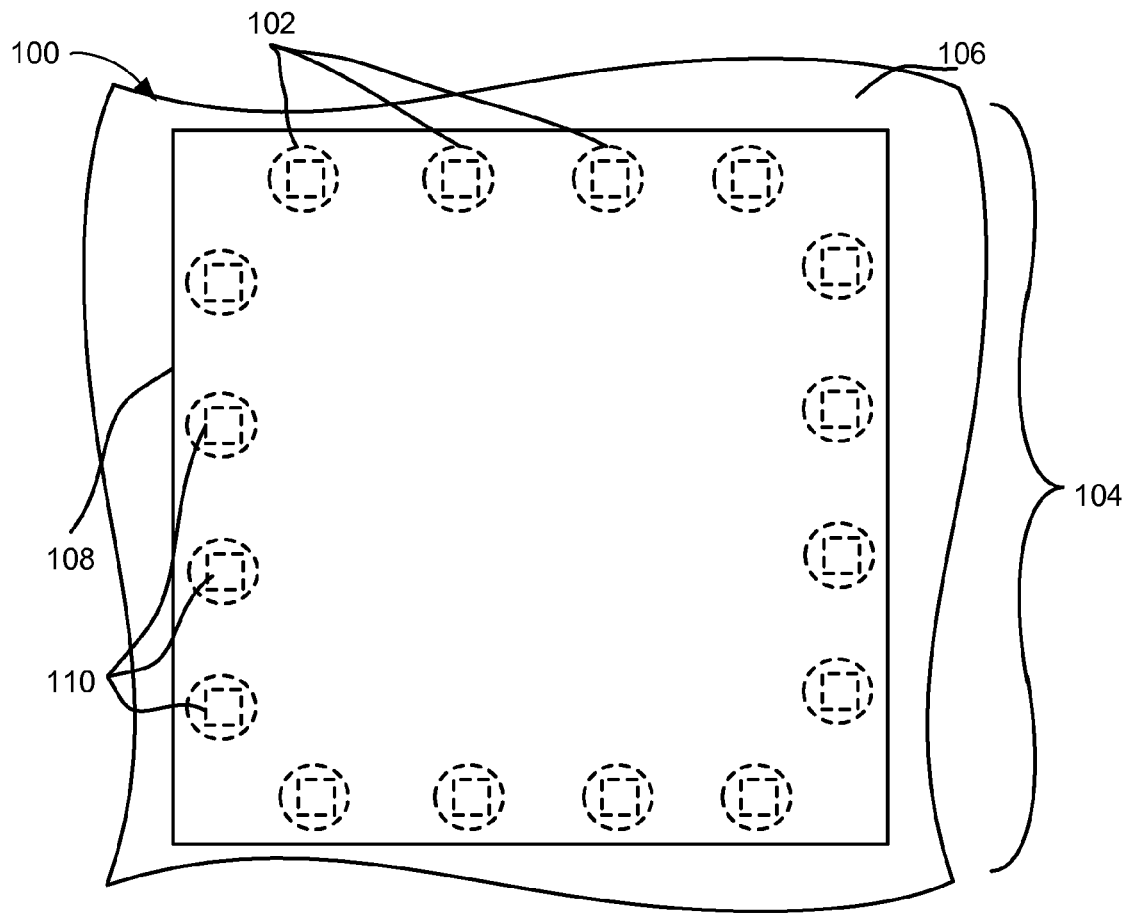
FIG. 1 is a top plan view of an integrated circuit mount system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGS. Similarly, although the sectional views in the drawings show for ease of description show the invention with surfaces as oriented downward, this arrangement in the FIGS. is arbitrary and is not intended to suggest that invention should necessarily be in a downward direction. Generally, the device can be operated in any orientation. In addition, the same numbers are used in all the drawing FIGS. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" refers to direct contact among the elements.

The term "processing" as used herein includes deposition of material or photoresist, patterning, exposure, development, etching, cleaning, and/or removal of the material or photoresist as required in forming a described structure.

Referring now to FIG. 1, therein is shown a top plan view of an integrated circuit mount system 100 in an embodiment of the present invention. The integrated circuit mount system 100 includes solder mask pads 102 on a substrate 104, such as a package substrate or a printed circuit board. The substrate 104 has an active surface 106. The active surface 106 can include active circuitry having connection circuitry for the substrate or printed circuit board. The solder mask pads 102 are attached to the active surface 106. The solder mask pads 102 provide an electrical connection for an integrated circuit 108 with bond pads 110 to a next level system, such as the substrate 104 of a package or printed circuit board. The solder mask pads 102 can also provide a mechanical connection for the integrated circuit 108 to the next level system. It has been discovered that the solder mask pads 102 provide an improved morphology to significantly improve first and second level reliability performance.

For illustrative purposes, one row of the solder mask pads 102 are shown on each side of the substrate 104 although it is understood that any number of rows of the solder mask pads 102 may be used. Further, for illustrative purposes, the solder mask pads 102 are shown in a configuration of a row although it is understood that any configuration may be used. It has been discovered that the solder mask pads 102 provide an improved morphology to significantly improve first and second level reliability performance.

Figure 2:
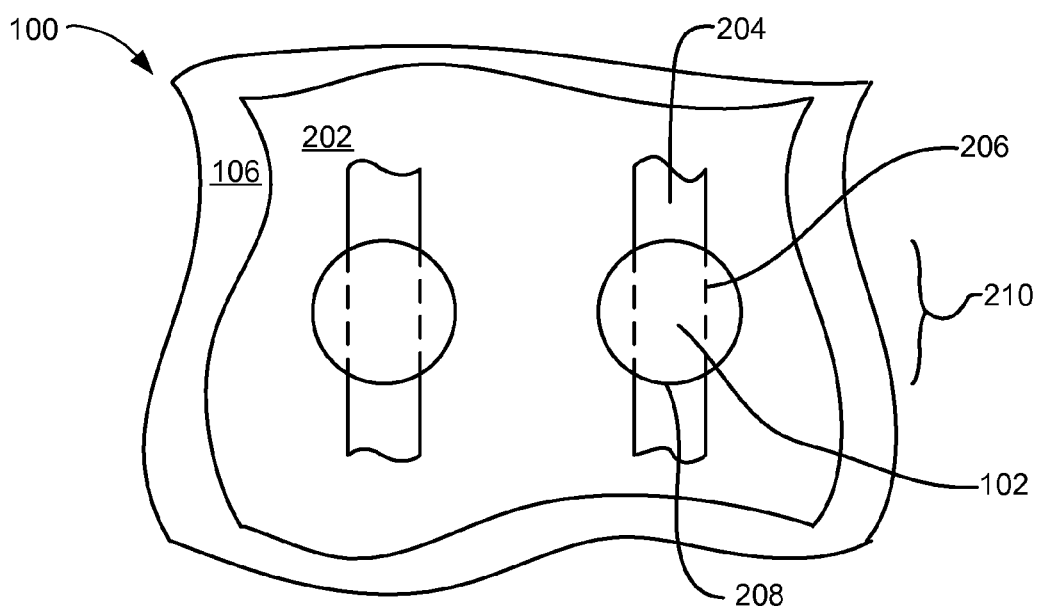
FIG. 2 is a top view of the integrated circuit mount system.

Referring now to FIG. 2, therein is shown a top view of the integrated circuit mount system 100. The integrated circuit mount system 100 includes the solder mask pads 102 defined by a solder mask 202, for the bond pads 110 of FIG. 1 of the integrated circuit 108 of FIG. 1, over the active surface 106 of the substrate 104 of FIG. 1. The solder mask pads 102 are attached to a semiconductor 204, such as a copper lead. Size and location of the solder mask pads 102 are defined by the solder mask 202, improving dimensional control, and alignment of the solder mask, the solder mask pads 102, and the semiconductor 204. Dimensional control and alignment of the solder mask 202, the solder mask pads 102, and the semiconductor 204 can be less than +/−25 um. It has been discovered that the integrated circuit mount system 100 reduces the planar dimensions and a height of the solder mask pads 102.

A pre-solderable layer 206, such as a pre-solderable layer or a pre-solderable plating layer can be applied through the solder mask 202 and over the solder mask pads 102. The pre-solderable layer 206 can include materials, such as electroless nickel with immersion gold, electroless nickel-phosphorous with immersion gold, or electroless nickel with electroless palladium and immersion gold. The pre-solderable layer 206 provides a surface for solder-on-pad 208 to be applied over the solder mask pads 102. The solder-on-pad 208 is formed within a solder mask opening 210 in the solder mask 202. The solder-on-pad 208 electrically and mechanically connects the solder mask pads 102 and the integrated circuit 108 of FIG. 1.

Figure 3:
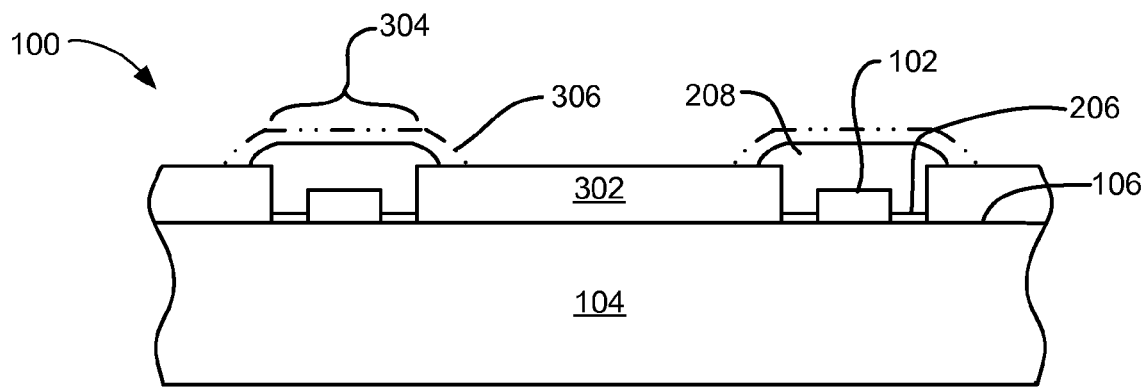
FIG. 3 is a cross-sectional view of the integrated circuit mount system.

Referring now to FIG. 3, therein is shown a cross-sectional view of the integrated circuit mount system 100. The integrated circuit mount system 100 includes the solder mask pads 102 and the pre-solderable layer 206 over and on the active surface 106 of the substrate 104. The pre-solderable layer 206 is applied adjacent to an oxide 302 in an oxide opening 304 directly on the substrate 104 in direct contact with sides of the solder mask pads 102. The pre-solderable layer 206 is in direct contact with and covers a portion of a vertical side of the oxide opening 304. The vertical side of the oxide opening 304 extends from the active surface 106 of the substrate 104 to a horizontal surface of the oxide 302 facing away from the active surface 106. The oxide opening 304 of the oxide 302 exposes the semiconductor 204 of FIG. 2 on the active surface 106 of the substrate 104. The solder-on-pad 208 is applied over the solder mask pads 102 and the pre-solderable layer 206 to form an electrical and mechanical connection between the integrated circuit mount system 100 and the integrated circuit 108 of FIG. 1.

The solder mask pads 102 provide electrical and mechanical connection between the semiconductor 204 on the active surface 106 of the substrate 104 and the solder-on-pad 208, in a manner similar to a bump pad 306 shown by phantom line. The bump pad 306 typically requires planar dimensions for the semiconductor 204, such as a substrate pad metal layer, of approximately 150 um to 100 um. The solder mask pads 102 of the integrated circuit mount system 100 provide significantly improved dimensional control and alignment. It has been discovered that the integrated circuit mount system 100 with the solder mask pads 102 allows a significant reduction in planar dimensions for the semiconductor 204, such as a pad metal layer, of the substrate 104 for forming the solder mask pads 102.

Figure 4:
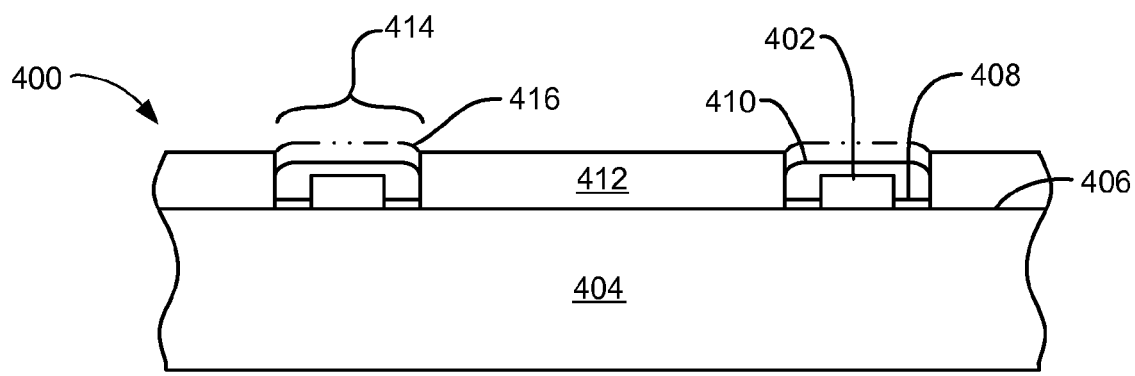
FIG. 4 is a cross-sectional view of an integrated circuit mount system in an alternative embodiment of the present invention.

Referring now to FIG. 4, therein is shown a cross-sectional view of an integrated circuit mount system 400 in an alternative embodiment of the present invention. The integrated circuit mount system 400 includes solder mask pads 402 and a pre-solderable layer 408, such as a pre-solderable protection or a pre-solderable plating layer, over an active surface 406 of a substrate 404. The pre-solderable layer 408 can include materials, such as electroless nickel with immersion gold, electroless nickel-phosphorous with immersion gold, or electroless nickel with electroless palladium and immersion gold.

The pre-solderable layer 408 is applied adjacent to an oxide 412 in an oxide opening 414. The oxide opening 414 of the oxide 412 exposes a semiconductor (not shown), similar to the semiconductor 204 of FIG. 2, on the active surface 406 of the substrate 404. The pre-solderable layer 408 provides a surface for solder-on-pad 410 to be applied over the solder mask pads 402. The solder-on-pad 410 is applied over the solder mask pads 402 and the pre-solderable layer 408 to form an electrical and mechanical connection between the integrated circuit mount system 400 and the integrated circuit 108 of FIG. 1.

The solder mask pads 402 provide electrical and mechanical connection between the semiconductor on the active surface 406 of the substrate 404 and the solder-on-pad 410, in a manner similar to a ball pad 416 shown by phantom line. The ball pad 416 typically requires planar dimensions for the semiconductor, such as a substrate pad metal layer, of approximately 150 um to 100 um. The solder mask pads 402 of the integrated circuit mount system 400 provide significantly improved dimensional control and alignment. It has been discovered that the integrated circuit mount system 400 with the solder mask pads 402 allows a significant reduction in planar dimensions for the semiconductor, such as a pad metal layer, of the substrate 404 for forming the solder mask pads 402.

Figure 5:
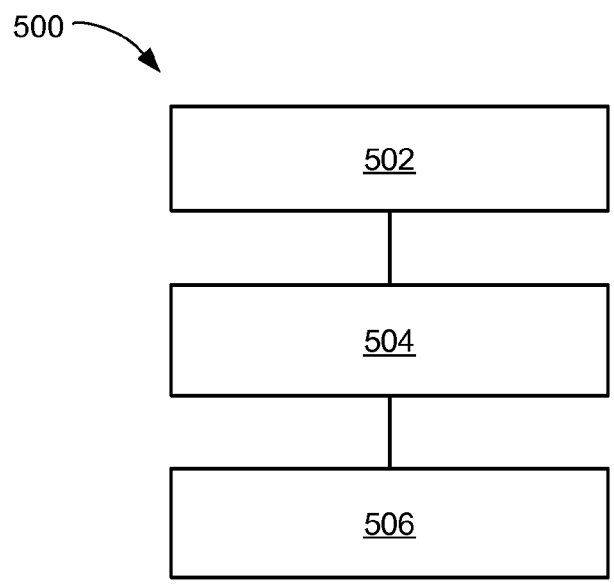
FIG. 5 is a flow chart of an integrated circuit mount system for manufacturing the integrated circuit mount system in an embodiment of the present invention.

Referring now to FIG. 5, therein is shown a flow chart of an integrated circuit mount system 500 for manufacturing the integrated circuit mount system 100 in an embodiment of the present invention. The system 500 includes providing an integrated circuit in a block 502; forming a solder mask for the integrated circuit in a block 504; and forming a solder mask pad on a substrate with the solder mask in a block 506.

In greater detail, a method to fabricate the integrated circuit mount system 100, in an embodiment of the present invention, is performed as follows:
1. Providing an integrated circuit having a bond pad. (FIG. 1)
2. Forming a solder mask for the bond pad of the integrated circuit. (FIG. 1)
3. Forming a solder mask pad on the bond pad with the solder mask. (FIG. 1)
4. Forming a connector on the solder mask pad. (FIG. 1)

It has been discovered that the present invention thus has numerous aspects.

An aspect is that the present invention improves the alignment of the solder mask and the semiconductor circuitry on the active surface of the substrate. The integrated circuit mount system with solder mask pad provides accurate alignment of the solder mask to the underlying semiconductor circuitry, such as metal patterns. The solder mask can be dimensionally controlled and accurately aligned to less than +/−25 um.

Another aspect is that the present invention provides an improved morphology of the solder mask pads. The improved morphology or shape of the solder mask pads significantly improves the structural integrity of the solder mask pads, the solder on pad applied over the solder mask pads, and associated semiconductor circuitry on the active surface of the substrate with solder mask pads.

It has been discovered that the disclosed structure provides reduced planar dimensions of the metal layer. The improved alignment of the solder mask and the substrate allows significant reduction of metal layer dimensions. The metal layer dimensions can be reduced significantly below what is typically from about 150 um to 100 um for substrate pads, such as flip chip bump pads.

It has also been discovered that the disclosed structure provides improved routability of the substrate. The reduced planar dimensions of the metal layer result in much smaller solder mask pads that improve the design routability of the substrate, such as a package or printed circuit board. The routability is significantly improved over other types of integrated circuit mounts that use bump pads and ball pads.

Yet another discovery is that the disclosed structure reduces copper lead blocking of crack propagation at an intermetallic layer. The improved morphology of the solder mask pads after solder joining can improve Cu lead blocking of crack propagation that are encountered at an intermetallic layer significantly improving the reliability of the integrated circuit mount system with solder mask pads.

Yet another discovery of the disclosed structure is that the disclosed structure reduces copper lead blocking of crack propagation between an intermetallic layer and bulk solder. The morphology of the solder mask pads after solder joining can improve Cu lead blocking of crack propagation between an intermetallic layer and bulk solder significantly improving the reliability of the integrated circuit mount system with solder mask pads.

Yet another discovery is that the disclosed structure improves first and second level reliability of the integrated circuit to a package and the package to a next level system, such as a printed circuit board. The morphology of the solder mask pads after solder joining can improve the first and second level reliability performance of an integrated circuit or package having the integrated circuit mount system with solder mask pads.

These and other valuable aspects of the present invention consequently further the state of the technology to at least the next level.

Thus, it has been discovered that the integrated circuit mount system method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method to fabricate an integrated circuit mount system comprising:
   providing a substrate having an active surface;
   stacking an integrated circuit over the substrate;
   forming a solder mask for the integrated circuit;
   forming a solder mask pad directly on the active surface of the substrate with the solder mask; and
   forming a pre-solderable layer directly on the active surface of the substrate and directly in contact with sides of the solder mask pad and a vertical side of the solder mask, the vertical side extending from the active surface to a horizontal side of the solder mask facing away from the active side.

2. The method as claimed in claim 1 wherein forming the solder mask pad includes forming the solder mask pad in an opening in the solder mask.

3. The method as claimed in claim 1 wherein forming the pre-solderable layer forms a metal layer on the substrate.

4. The method as claimed in claim 1 wherein forming the solder mask pad includes forming the solder mask pad having a height lower than the height of a bump or ball pad.

5. The method as claimed in claim 1 wherein forming the solder mask pad includes forming the solder mask pad having a planar dimension smaller than a planar dimension of a bump or ball pad.

6. A method to fabricate an integrated circuit mount system comprising:
   providing a substrate having an active surface;
   stacking an integrated circuit, having a bond pad, over the substrate;
   forming a solder mask for the bond pad of the integrated circuit;
   forming a solder mask pad on the active surface of the substrate with the solder mask;
   forming a pre-solderable layer directly on the active surface of the substrate and directly in contact with sides of the solder mask pad and a vertical side of the solder mask, the vertical side extending from the active surface to a horizontal side of the solder mask facing away from the active side; and forming a connector directly on the pre-solderable layer and the solder mask pad.

7. The method as claimed in claim 6 wherein forming the solder mask pad includes forming the solder mask pad self-aligned to the solder mask.

8. The method as claimed in claim 6 wherein forming the solder mask pad includes forming the solder mask pad having a width less than 150 um.

9. The method as claimed in claim 6 wherein forming the solder mask pad includes applying solder-on-pad over the solder mask pad.

10. The method as claimed in claim 6 wherein forming a connector includes providing improved reliability of an intermetallic layer under the connector.

11. An integrated circuit mount system comprising:
a substrate having an active surface;
an integrated circuit over the substrate;
a solder mask for the integrated circuit;
a solder mask pad directly on the active surface of the substrate with the solder mask; and
a pre-solderable layer directly on the active surface of the substrate and directly in contact with sides of the solder mask pad and a vertical side of the solder mask extending from the active surface to a horizontal side of the solder mask facing away from the active side.

12. The system as claimed in claim 11 wherein the solder mask pad includes the solder mask pad in an opening in the solder mask.

13. The system as claimed in claim 11 wherein the pre-solderable layer forms a metal layer on the substrate.

14. The system as claimed in claim 11 wherein the solder mask pad includes the solder mask pad having a height lower than the height of a bump or ball pad.

15. The system as claimed in claim 11 wherein the solder mask pad includes the solder mask pad having a planar dimension smaller than a planar dimension of a bump or ball pad.

16. The system as claimed in claim 11 wherein:
the integrated circuit having a bond pad;
the solder mask for the bond pad of the integrated circuit;
the solder mask pad on the substrate with the solder mask; and further comprising:
a connector on the solder mask pad.

17. The system as claimed in claim 16 wherein the solder mask pad includes the solder mask pad self-aligned to the solder mask.

18. The system as claimed in claim 16 wherein the solder mask pad includes the solder mask pad having a width less than 150 um.

19. The system as claimed in claim 16 wherein the solder mask pad includes solder-on-pad over the solder mask pad.

20. The system as claimed in claim 16 wherein a connector includes improved reliability of an intermetallic layer under the connector.

\* \* \* \* \*

UNITED STATES PATENT AND TRADEMARK OFFICE
CERTIFICATE OF CORRECTION

PATENT NO.       : 8,124,520 B2                                               Page 1 of 1
APPLICATION NO.  : 11/456551
DATED            : February 28, 2012
INVENTOR(S)      : Kim et al.

It is certified that error appears in the above-identified patent and that said Letters Patent is hereby corrected as shown below:

Column 4:

lines 11-12, delete "The pre-solderabie layer 206" and insert therefor --The pre-solderable layer 206--

Signed and Sealed this
Nineteenth Day of June, 2012

David J. Kappos
*Director of the United States Patent and Trademark Office*